(12) United States Patent
Baker et al.

(10) Patent No.: US 9,551,064 B2
(45) Date of Patent: Jan. 24, 2017

(54) MOISTURE-RESISTANT AND ANTI-CORROSIVE ENERGY STORAGE DEVICES AND ASSOCIATED METHODS

(71) Applicant: HZO, Inc., Draper, UT (US)

(72) Inventors: Layton Baker, Draper, UT (US); Jianhua Su, Draper, UT (US); Rick Peterson, Draper, UT (US); Max Sorenson, Herriman, UT (US)

(73) Assignee: HZO, Inc., Draper, UT (US)

( * ) Notice: Subject to any disclaimer, the term of this patent is extended or adjusted under 35 U.S.C. 154(b) by 0 days.

(21) Appl. No.: 14/788,648

(22) Filed: Jun. 30, 2015

(65) Prior Publication Data

US 2015/0311494 A1  Oct. 29, 2015

Related U.S. Application Data

(63) Continuation-in-part of application No. 13/920,576, filed on Jun. 18, 2013.

(60) Provisional application No. 61/660,827, filed on Jun. 18, 2012.

(51) Int. Cl.

| | |
|---|---|
| *H01M 2/30* | (2006.01) |
| *H01M 2/02* | (2006.01) |
| *C23C 16/04* | (2006.01) |
| *C23C 14/34* | (2006.01) |
| *C23C 16/455* | (2006.01) |
| *H01M 2/10* | (2006.01) |
| *H01M 10/42* | (2006.01) |
| *H01M 2/32* | (2006.01) |
| *H01M 10/0525* | (2010.01) |

(52) U.S. Cl.
CPC .............. *C23C 14/34* (2013.01); *C23C 16/042* (2013.01); *C23C 16/45555* (2013.01); *H01M 2/0237* (2013.01); *H01M 2/1094* (2013.01); *H01M 2/32* (2013.01); *H01M 10/425* (2013.01); *H01M 10/0525* (2013.01); *H01M 2220/20* (2013.01); *Y10T 29/49115* (2015.01)

(58) Field of Classification Search
CPC ...................................................... H01M 2/34
See application file for complete search history.

(56) References Cited

U.S. PATENT DOCUMENTS

| | | | |
|---|---|---|---|
| 6,524,739 B1* | 2/2003 | Iwaizono | H01M 2/34 429/185 |
| 2003/0129487 A1* | 7/2003 | Inoue | H01M 2/0262 429/176 |
| 2005/0151514 A1* | 7/2005 | Kozu | H01M 2/0404 320/147 |

* cited by examiner

*Primary Examiner* — Barbara Gilliam
*Assistant Examiner* — Stephan Essex
(74) *Attorney, Agent, or Firm* — Kunzler Law Group

(57) ABSTRACT

The disclosure extends to protectively coated energy storage devices, such as rechargeable batteries, and associated methods of forming the same. An energy storage device, such as a rechargeable battery, may comprise a cell including at least one electrical terminal and a circuit board electrically coupled to the at least one electrical terminal. The rechargeable battery may also include a protective coating on at least a portion of at least one of a surface of the cell and/or at least one surface of the circuit board. The protective coating may reside between the circuit board and the cell. The protective coating may comprise a moisture resistant coating that will withstand exposure to corrosive agents, including electrolytes, corrosive gases and dust.

15 Claims, 5 Drawing Sheets

MOISTURE-RESISTANT AND ANTI-CORROSIVE ENERGY STORAGE DEVICES AND ASSOCIATED METHODS

CROSS-REFERENCE TO RELATED APPLICATION

This application is a continuation-in-part of U.S. patent application Ser. No. 13/920,576, filed on Jun. 18, 2013, and titled MOISTURE RESISTANT ENERGY STORAGE DEVICES AND ASSOCIATED METHODS ("the '576 application"). In the '576 application, a claim for the benefit of priority was made pursuant to 35 U.S.C. §119(e) to the Jun. 18, 2012 filing date of U.S. Provisional Patent Application No. 61/660,827, titled WATER RESISTANT BATTERIES AND ASSOCIATED METHODS ("the '827 Provisional Application"). The entire disclosures of the '576 application and the '827 Provisional Application are, by this reference, incorporated herein.

TECHNICAL FIELD

This disclosure relates generally to energy storage devices, such as rechargeable batteries, fuel cells, ultra capacitors, supercapacitors, electrochemical capacitors, battery/capacitor hybrids, zinc air batteries and the like and, more specifically, to energy storage devices with protective coatings, including, without limitation, moisture resistant coatings. In addition, this disclosure relates to anti-corrosive energy storage devices, as well as to methods for rendering energy storage devices anti-corrosive.

RELATED ART

Energy storage devices have long been used to store electricity and provide it to devices to render them portable and to provide a back-up source of electricity when electrical power is interrupted (e.g., temporarily due to power outages, permanently, etc.). The use of lithium ion batteries has become particularly prominent over recent years due to their light weight, high voltage (e.g., up to about 4V) and high energy density (e.g., up to about 870 Wh/kg). The primary components of a lithium ion battery 1 are illustrated by FIG. 4, and include a cell 2 that contains an anode 3 and a cathode 7, as well as a separator 6 between the anode 3 and the cathode 7. The anode 3 may include a current collector 4, which is often formed from copper (Cu), as well as an electrolyte 5, which typically comprises a lithium salt (e.g., $LiPF_6$, etc.) in an organic solvent (e.g., one or more carbonates, etc.). The separator 6 may comprise a thin porous element (e.g., porous polyethylene having a thickness of about 10 μm to about 40 μm, etc.). The cathode 7 may include a current collector 8, which is often formed from aluminum (Al), as well as an ionic solution including lithium ions ($Li^+$) and $Li-xMO_2$, where M may comprise manganese (Mn), Cobalt (Co), Nickel (Ni) or any other suitable metal. Notably, FIG. 4 shows the lithium ion battery 1 in a discharge state; electrons and lithium ions move in the opposite directions from those shown during charging.

Lithium ion batteries are known to occasionally suffer from a phenomenon that has been referred to as "thermal runaway." When the temperature of a lithium ion battery reaches or exceeds about 70° C. or more, the lithium ion battery may rapidly self-heat. When the temperature of a lithium ion battery 1 increases in an uncontrolled manner, the separator 6 may melt (e.g., when its temperature reaches or exceeds about 150° C.), the pressure within the lithium ion battery 1 may increase. An increase in pressure within a lithium ion battery 1 may cause the cell of the lithium ion battery 1 to swell, which may merely result in cosmetic defects. In some cases, however, swelling of the cell may allow the electrolyte within the cell to leak out of the cell, which may lead to more drastic damage to the lithium ion battery 1, as well as to structures that surround the lithium ion battery 1. For example, if the electrolyte that escapes from a swollen cell of a lithium ion battery comes into contact with the live (i.e., electricity-conducting) circuits on a circuit board, the electrolyte may cause an electrical arc, which may ignite the electrolyte, resulting in fire or even an explosion.

SUMMARY

The teachings of this disclosure relate generally to methods for making devices that store electrical energy resistant to moisture, as well as to moisture-resistant devices for storing electrical energy. While the foregoing description refers specifically to rechargeable batteries and various components of rechargeable batteries, teachings of this disclosure are also applicable to other types of devices that store electrical energy (e.g., fuel cells, ultra capacitors, super capacitors, electrochemical capacitors, battery/capacitor hybrids, zinc air batteries, etc.). Such devices are referred to herein as "energy storage devices" and "batteries"; both of these terms, as used herein, encompass conventional batteries, as well as all other types of devices that store electrical energy.

Methods and energy storage devices that incorporate teachings of this disclosure may include one or more protective coatings, including, but not limited to, moisture resistant coatings. As used herein, the term "protective coating" includes moisture resistant coatings or films, coatings or films that prevent corrosive agents from contacting a coated feature, structure or device, as well as other coatings or films that protect various parts of an electronic assembly from moisture and/or other external influences. While the term "moisture resistant coating" is used throughout this disclosure, in many, if not all, circumstances, a moisture resistant coating may comprise or be substituted with a protective coating that protects coated components and/or features from other external influences.

The term "moisture resistant" refers to the ability of a coating to prevent exposure of a coated element or feature to moisture. A moisture resistant coating may resist wetting or penetration by one or more types of moisture, or it may be impermeable or substantially impermeable to one or more types of moisture. A moisture resistant coating may repel one or more types of moisture. In some embodiments, a moisture resistant coating may be impermeable to, substantially impermeable to or repel water, an aqueous solution (e.g., salt solutions, acidic solutions, basic solutions, drinks, etc.) or vapors of water or other aqueous materials (e.g., humidity, fogs, mists, etc.), wetness, etc.). Use of the term "moisture resistant" to modify the term "coating" should not be considered to limit the scope of materials from which the coating protects one or more components of an electronic device. The term "moisture resistant" may also refer to the ability of a coating to restrict permeation of or repel organic liquids or vapors (e.g., organic solvents, other organic materials in liquid or vapor form, etc.), as well as a variety of other substances or conditions that might pose a threat to an electronic device or its components. Various aspects relating to the use of masks in the application of protective coatings are disclosed.

Alternatively, or in addition, a protective coating according to this disclosure may prevent corrosion of an energy storage device. In some embodiments, a protective coating may prevent corrosive damage to circuit board, electronic components or other components of an energy storage device. As such damage may be caused by a variety of factors, or corrosive agents. Such corrosive agents may include, but are not limited to, electrolytes (which may leak from the battery), corrosive gas(es) (from the battery or an external source) and solid dust particles. The protective coating may be configured to prevent the circuit board, electronic components or other components of the energy storage device from one or more of these corrosive agents. In a more specific embodiment, a protective coating according to this disclosure may be applied to exposed portions of the current collectors (e.g., aluminum current collectors, etc.) of a lithium ion battery to prevent the current collectors from being exposed to potentially corrosive electrolytes.

According to one embodiment of an energy storage device, a rechargeable battery, comprises a cell. The cell may be bare or wrapped, coated or otherwise covered. In addition to the cell, the rechargeable battery may also include at least one electrical terminal and a circuit board (e.g., for surge protection, monitoring, control, etc.) electrically coupled to the at least one electrical terminal. The rechargeable battery may also include a moisture-resistant coating over at least a portion of at least one of a surface of the circuit board and/or a component carried by the circuit board to prevent moisture from contacting each coated feature. Optionally, a moisture-resistant coating may cover at least a portion of at least one surface of the cell.

Another embodiment of an energy storage device may include a cell of a rechargeable battery. The cell may comprise a cap plate that forms a first surface. The cap plate may be made of the same material of either the anode or the cathode, or a different material. The cell may further include an electrical terminal exposed through the first surface of the cap plate and configured to electrically couple to a protective circuit board. Furthermore, the cell may include a moisture resistant coating on at least a portion of the first surface of the cap plate.

In another aspect, a protective circuit board of an energy storage device may include a first surface with an exposed electrical terminal configured for electrically coupling to a cell. The protective circuit board may further include a moisture resistant coating on at least a portion of the first surface. The coating may have a relatively low dielectric constant and may not store, retain or transmit a significant charge.

In some embodiments, combinations of features, and even combinations of electrically coupled assemblies may be coated with one or more protective coatings. For example, an energy storage assembly, such as a battery assembly, may comprise a cell and a circuit board, one or both of which may be at least partially coated with a protective coating. In some embodiments, a protective coating, or a portion thereof, may reside between the cell and the circuit board. Regardless of where the protective coating or coatings are located, the circuit board may be in electrical communication with at least one electrical terminal of the cell.

Another aspect of this disclosure may include a method for assembling an energy storage device, such as a rechargeable battery. The method may include applying a first protective coating to at least a portion of a surface of a cell of a rechargeable battery with a first electrical terminal. The method may further include applying a second protective coating to at least a portion of a surface of a circuit board that includes a second electrical terminal. Further, after applying the first and second protective coatings, the method may include electrically coupling the first electrical terminal to the second electrical terminal. Further protective coatings may be applied after the energy storage device has been assembled; such a protective coating may, for example, cover contacts of the battery (e.g., electrically conductive elements coupling the cell to the circuit board, etc.).

In yet another aspect, a method for assembling a rechargeable battery may include electrically coupling a cell to a circuit board to form an energy storage assembly (e.g., a battery assembly, etc.). Additionally, the method may include applying a protective coating to at least a portion of a surface of the energy storage assembly, wherein the circuit board includes at least one exposed electrical contact.

Other aspects, as well as features and advantages of various aspects, of the disclosed subject matter will become apparent to those of skill in the art though consideration of the ensuing description, the accompanying drawings and the appended claims.

DETAILED DESCRIPTION

As will be appreciated by a person having ordinary skill in the art, one or more energy storage devices, such as one or more rechargeable batteries, may be used in a variety of different types of devices. Without limitation, energy storage devices may be used in electronic devices, such as portable electronic devices. Further, energy storage devices may include electric vehicle batteries used in vehicles (e.g., off-road vehicles, cross-over utility vehicles (XUVs), automobiles, drones, airplanes, etc.) or any other machinery. Energy storage devices are also used to provide back-up power to homes and other buildings, as well as for a variety of commercial purposes. Some more specific examples of portable electronic devices with which one or more energy storage devices may be used include, but are not limited to, laptop computers, so-called "mobile" electronic devices (e.g., cellular telephones, smart phones, mobile computing devices (e.g., so-called "tablet" computing devices, etc.), digital media players, personal digital assistant (PDA) devices, etc.), cameras, portable electronic accessories (e.g., wireless headphones, wireless headsets, mobile speakers, wireless keyboards, wireless mice, etc.), and a variety of other portable electronic devices. Energy storage devices according to this disclosure may also be used with a wide variety of other products, some non-limiting examples of which include drones, electric vehicles and equipment, gas-electric (or other types of) hybrid vehicles and equipment, power tools, gardening tools, exercise equipment and toys. A few non-limiting examples of rechargeable batteries include lithium ion batteries, lithium ion polymer batteries, nickel-cadmium batteries, nickel-metal hydride batteries, super capacitors, ultra capacitors, electrochemical capacitors, battery/capacitor hybrids, fuel cells, and zinc air batteries. Although this disclosure focuses on embodiments of energy storage devices that comprise lithium ion batteries, the teachings of this disclosure are broadly applicable to a variety of different types of energy storage devices. Rather, embodiments of various elements of the disclosed subject matter may include any known and suitable rechargeable battery, as well as any other type of portable energy storage device.

According to various embodiments, an energy storage device may include a cell and a circuit board, as well as a moisture resistant coating over at least a portion of one or both of the cell and the circuit board. More specifically, for example, an energy storage device may include a moisture resistant coating on part or all of the circuit board and the cell. Even more specifically, the moisture resistant coating may prevent moisture from contacting electrical couplings between the cell and the circuit board. A moisture resistant coating may limit or prevent exposure of other electrical components of one or both of the circuit board and the cell to moisture.

Figure 1:
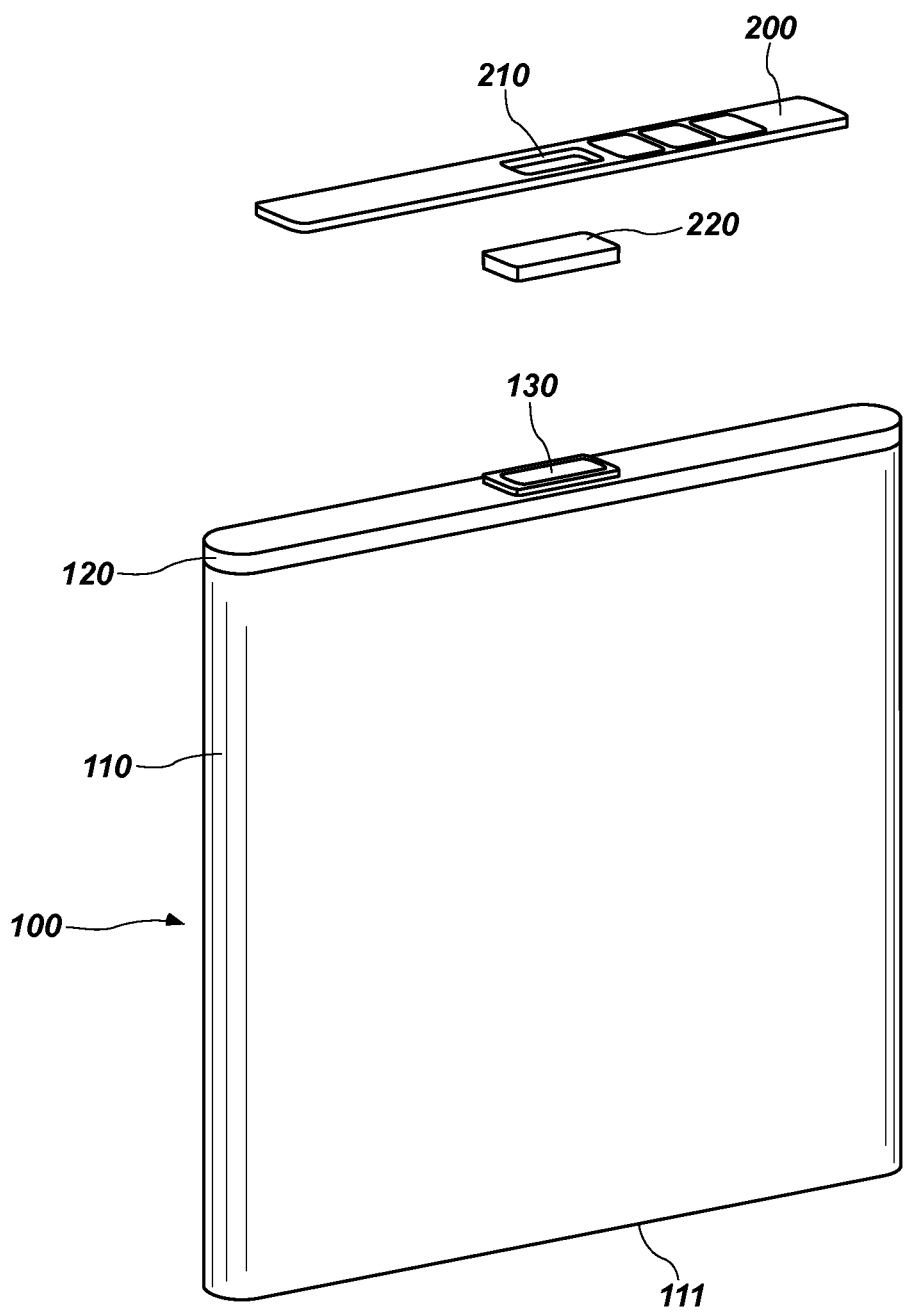
FIG. 1 is a perspective view of an energy storage device, comprising a cell and a circuit board of a rechargeable battery.
Figure 2A:
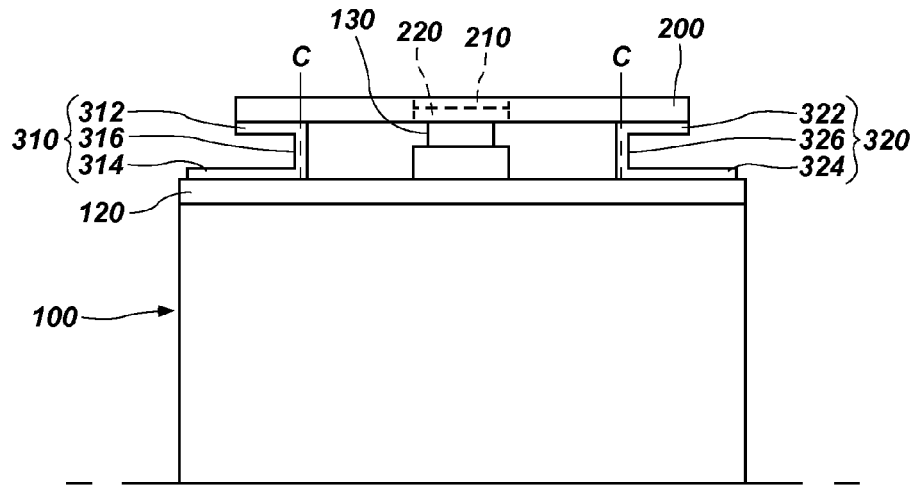
FIG. 2A is a side view of an embodiment of an energy storage device, which comprises a rechargeable battery including a cell and a circuit board.

FIG. 1 is an exploded perspective view illustrating a cell and a circuit board of an embodiment of energy storage device that comprises a conventional rechargeable battery 10. FIG. 2A is a side view illustrating the conventional rechargeable battery 10. Referring to FIGS. 1 and 2A, the rechargeable battery 10 includes a cell 100 and a circuit board 200 configured to be positioned proximate to an upper surface of the cell 100. Further, the rechargeable battery 10 includes lead plates 310 and 320 (see FIG. 2A) disposed between the circuit board 200 and the cell 100 so as to electrically couple the circuit board 200 to the cell 100. As illustrated, lead plate 310 may include portions 312, 314, and 316, and lead plate 320 may include portions 322, 324, and 326. As will be appreciated by a person having ordinary skill in the art, the rechargeable battery 10 may also include an upper cover (not shown) installed so as to cover a surface 115 of the cell 100 that faces the circuit board, which may also be referred to as an "upper surface" of the cell 100, while surrounding the circuit board 200 and fixing the circuit board 200 to surface 115 of cell 100 adjacent to the circuit board 200. In addition, the rechargeable battery 10 may include a lower cover (not shown) fixed to another surface 111 of the cell 100, which surface 111 is opposite from surface 115 and faces away from the circuit board 200, as well as a label sheet (not shown) wrapped or wound about the cell 100.

As will be further appreciated, the cell 100 of the rechargeable battery 10 includes an electrode assembly (not shown), which may be comprised of a cathode plate, a separator, and an anode plate, a can 110 to contain the electrode assembly and an electrolytic solution, a cap assembly (not shown) including a cap plate 120 sealing an opening part of the can 110, and an electrode terminal 130 that extends through cap plate 120 to connect the electrode assembly to an electrical terminal 220 of the circuit board 200. The cathode plate may comprise or be associated with (e.g., electrically coupled to, positioned directly adjacent to, etc.) a current collector (e.g., an aluminum current collector, etc.). A current collector may include one or more features that protrude from the cathode to enable electrons to be communicated to the cathode, by communicating with the electrode terminal 130.

A hole 210 may extend through the circuit board 200 at a location that corresponds to a position where the electrode terminal 130 of the cell 100 is provided. The electrode terminal 130 is connected to an electrical terminal 220 through the hole 210 of the circuit board 200. By way of example only, electrode terminal 130 may be connected to electrical terminal 220 via laser welding, wire bonding, soldering, or any other known and suitable manner (e.g., mechanical attachment). Lead plates 310 and 320 are installed at both ends of the cap plate 120 of the cell 100. The lead plates 310 and 320 electrically couple the circuit board 200 to the cell 100. It is noted that lead plates 310 and 320 may be electrically isolated from others components of battery, if needed, to prevent undesired interference. It is further noted that the cell 100 may include another electrical terminal (not shown) that extends through surface 111 of the cell 100, opposite from the cap plate 120. The electrical terminal 130 may extend through surface 111 and connect the electrode assembly to an electrical terminal (not shown) of the circuit board 200 via lead plate 310 or lead plate 320.

Figure 2B:
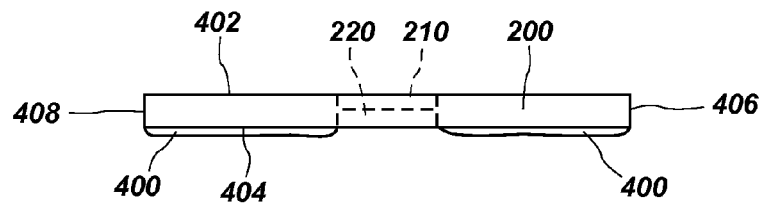
FIG. 2B is a side view of an embodiment of a circuit board with a protective coating on a surface thereof.

In FIG. 2B, the circuit board 200 is illustrated in greater detail. The circuit board 200 includes a first surface 402 and a second surface 404 opposite from the first surface 402. The circuit board 200 also includes a surface 406 adjacent to each of surface 402, as well as peripheral edges 404 and 408, which are located between and adjacent to surface 402 and surface 404. The location of the hole 210 through the circuit board 200 corresponds to a position where an electrical terminal (e.g., electrical terminal 130) of a cell (e.g., the cell 100) may be positioned. The electrode terminal 130 may be electrically coupled to the electrical terminal 220 of the circuit board 200. As illustrated in FIG. 2B, a protective coating 400, which is conformal, is disposed on at least a portion of surface 404. Such a protective coating 400 may prevent moisture and/or corrosive agents from contacting coated portions of the circuit board 200. Thus, protective coating 400 may prevent corrosion of connector leads and current traces, which could otherwise cause the battery to malfunction (e.g., by shortening one or more circuits; damaging a thermal sensor of the battery, which could result in overheating of the battery and increase the likelihood that the battery will catch fire or explode; etc.).

It is noted that according to one embodiment, a mask or coating release element may be applied to the electrical terminal 220 prior to a process of disposing protective coating 400 on the circuit board 200. The mask or coating release element (e.g., a film or structure to which the material of the protective coating 400 will not adhere, etc.) and/or a portion of the protective coating 400 may then be removed to expose the electrical terminal 220 and, thus, enable it to be electrically coupled to another terminal. It is noted that a mask or coating release element may be applied to any part of the circuit board 200 that could be adversely affected by a protective coating. According to another embodiment, after the protective coating 400 has been formed or otherwise disposed on surface 404, including electrical terminal 220, the protective coating 400 may be etched or otherwise removed from the portions of the surface 404, including from the electrical terminal 220 to expose the electrical terminal 220 for electrically coupling to another terminal, or to expose any other feature of the circuit board 200.

Figure 2C:
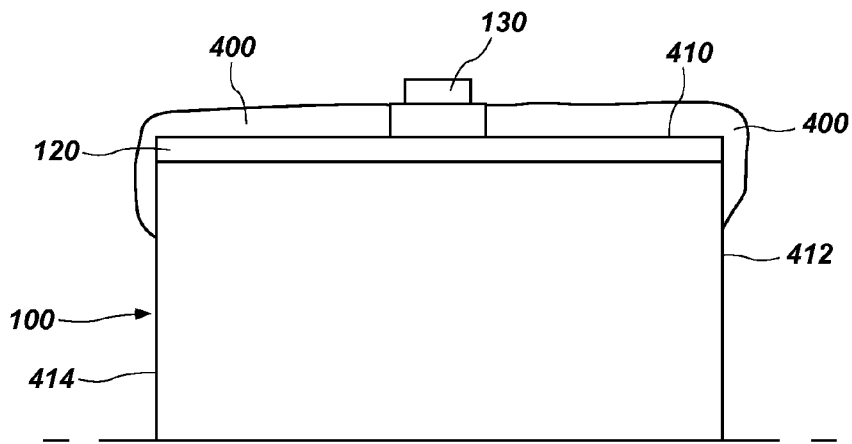
FIG. 2C is a side view an embodiment of a cell with a protective coating on a surface thereof.

FIG. 2C illustrates the cell 100, including the electrical terminal 130 and the cap plate 120, which has a surface 410. Further, a protective coating 400 is disposed on at least a portion of the surface 410 of the cell 100. Further, as illustrated in FIG. 2C, the protective coating 400 may be disposed on part(s) or all of one or more peripheral edges 412, 414 of the cell 100, which may be adjacent to and oriented at an angle from the surface 410.

By covering the peripheral edges 412, 414 of the cell 100, the protective coating 400 may protect one or more features of the cell 100, including, without limitation, the cathode plate and any current collector of the cathode plate or associated with the cathode plate. Additionally, application of a protective coating 400 to the exterior of the cell 100 may seal the electrolytes contained by the cell 100 within the cell 100, even if the cell 100 experiences swelling; therefore preventing leakage of the electrolyte from the cell 100, as well as the potential damage that may occur due to electrolyte leakage (e.g., electrical shorts and arcs, fire, explosion, etc.).

By applying the protective coating 400 to exposed portions of a current collector, corrosion of the current collector, which has been known to occur even with aluminum current collectors (e.g., by reaction of electrolytes with a generally passive aluminum film or foil, in the form of pitting that occurs during charge-discharge cycles over the life of the battery, due to deterioration of $LiPF_6$ or any other suitable lithium salt from moisture exposure, etc.), may be prevented.

It is noted that according to one embodiment, a mask or coating release element may be applied to the electrical terminal 130 prior to a process of disposing protective coating 400 on the cell 100. The mask, coating release element and/or a portion of the protective coating 400 may then be removed to expose the electrical terminal 130 for electrical coupling to another terminal (e.g., the electrical terminal 220 of the circuit board 200). It is noted that a mask or a coating release element may be applied to any part of the cell 100 that could be adversely affected by a protective coating 400. According to another embodiment, after the protective coating 400 has been formed or otherwise disposed on the surface 404, including over the electrical terminal 130, part(s) of the protective coating 400 may be etched or otherwise removed from the surface 404, including portions of the protective coating 400 that are located over the electrical terminal 130 to expose electrical terminal 130 for electrical coupling to another terminal.

Optionally, the rechargeable energy storage element may be fully installed in the portable electronic device during coating, such that a close mechanical fit between the cap plate and the electrical terminals effectively insures a moisture barrier.

The rechargeable energy storage element may be coated while attached to a dummy cap plate, so that after separation from the dummy cap plate, the electrically conducting portion of the electrical terminal of the rechargeable energy storage element is of a size designed to mate precisely with the conducting surface of an actual cap plate, or alternately, has been designed to be slightly smaller than the conducting surface of an actual cap plate, thereby providing a dielectric barrier that may comprise a rim and de facto mini gasket at the terminal cap plate junction.

In an alternate embodiment, the cap plate may be coated while attached to a dummy electrical terminal, so that after separation from the dummy electrical terminal, the conducting portion of the cap plate is of a size designed to mate precisely with an actual electrical terminal, or alternately, has been designed to be slightly smaller than the conducting surface of an actual terminal, thereby providing a dielectric barrier that may comprise a de facto mini gasket at the cap plate terminal junction.

With reference to FIGS. 2B and 2C, it is noted that the circuit board 200 may be coupled (e.g., electrically and physically) to the cell 100 after the protective coating 400 has been applied to the surface 404 of the circuit board 200, the surface 410 of the cell 100, or both. Stated another way, although the protective coating 400 may be positioned between the circuit board 200 and the cell 100, it is not required that the protective coating 400 be applied to both the circuit board 200 and the cell 100 prior to coupling the circuit board 200 to the cell 100.

Figure 2D:
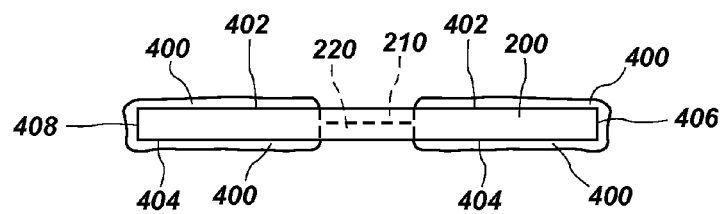
FIG. 2D is a side view of an embodiment of a circuit board with protective coatings on a plurality of surfaces thereof.

FIG. 2D illustrates the circuit board 200 with the protective coating 400 disposed on at least a portion of each of the surfaces 402 and 404 and the peripheral edges 406 and 408. As noted above with respect to FIG. 2B, according to one embodiment, a mask or coating release element may be applied to the electrical terminal 220 prior to a process of disposing a protective coating 400 on the circuit board 200. The mask or coating release element and/or one or more portions of the protective coating 400 may then be removed to expose the electrical terminal 220 for electrical coupling to another terminal. It is noted that a mask or coating release element may be applied to any part of the circuit board 200 that could be adversely affected by a protective coating. According to another embodiment, after the protective coating 400 has been formed or otherwise disposed on the surfaces 402 and 404, and on the electrical terminal 220, one or more portions of the protective coating 400 may be etched or otherwise removed from portions of the surfaces 402, 404, including from the electrical terminal 220 to expose the electrical terminal 220 for electrical coupling to another terminal. Further, a gel, such as an anti-corrosion gel, may be applied to electrical terminal 220 prior to coupling electrical terminal 220 to another terminal (e.g., terminal 130 of cell 100). The gel, which does not solidify and, thus, may be displaced upon coupling electrical terminal 220 to another terminal, allows for repeated connection and disconnection of the two terminals.

Figure 2E:
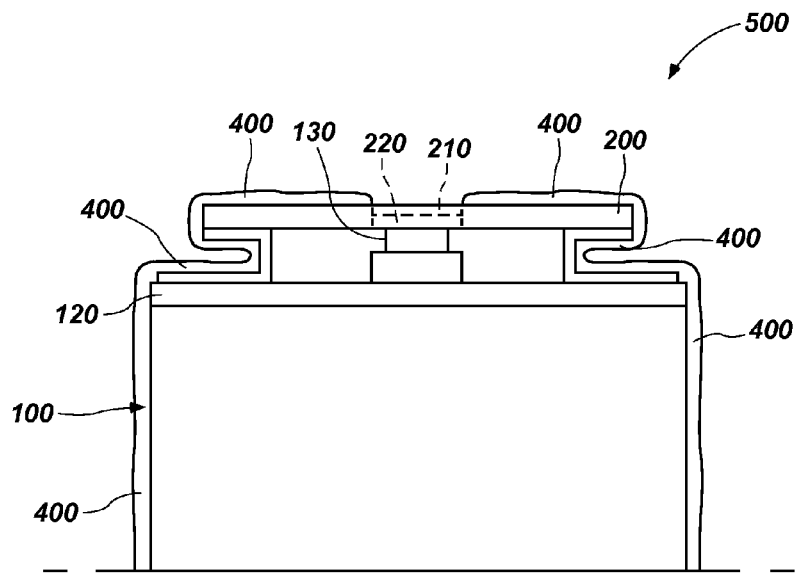
FIG. 2E is a side view of an embodiment of a rechargeable battery including a cell, a circuit board, and a protective coating covering a surface of the rechargeable battery.

FIG. 2E illustrates an embodiment of an energy storage assembly that comprises a battery assembly 500 including a cell 100 and a circuit board 200. Further, the battery assembly 500 includes lead plates 310 and 320 (see FIG. 2A) disposed between the circuit board 200 and the cell 100 to electrically couple the circuit board 200 to the cell 100. As illustrated in FIG. 2E, an electrode terminal 130 extends through a cap plate 120 and couples to an electrical terminal 220 of the circuit board 200. Further, the battery assembly 500 includes a protective coating 400 over at least a portion of the circuit board 200 and over at least a portion of the cell 100. Further, the protective coating 400 may cover at least a portion of each of the lead plates 310 and 320. It is noted that the electrical terminal 220 is exposed via a hole 210 through the circuit board 200 and, thus, may be electrically coupled to another terminal (e.g., a terminal of an electronic device). Moreover, although not illustrated in FIG. 2E, an interior surface of the battery assembly 500 may include a protective coating. More specifically, for example, a protective coating may exist between the circuit board 200 and the cell 100, such as described with reference to FIGS. 2B and 2C. According to one embodiment, an entire outer surface of the battery assembly 500, except for electrical terminals that are configured to electrically connect the battery assembly 500 to an external component (e.g., an electronic device, etc.), may have a protective coating 400 thereon. Further, after an external component is electrically connected to an electrical terminal of battery assembly 500, a protective coating may be applied to the connection. As a more specific example, after electrical terminals of battery assembly 500 are permanently wired to an external component, such as a circuit board, the battery assembly 500 including the electrical terminals may be coated with a resistant coating.

A mask or coating release element may be applied to the electrical terminal 220 prior to forming or otherwise disposing the protective coating 400 on the battery assembly 500. The mask or coating release element and/or one or more portions of the protective coating 400 may then be removed to expose the electrical terminal 220 for electrically coupling to another terminal. It is noted that a mask or coating release element may be applied to any part of the battery assembly 500 that could be adversely affected by a protective coating. According to another embodiment, after the protective coating 400 has been formed or otherwise disposed on one or more surfaces of the battery assembly 500, including on the electrical terminal 220, one or more portions of the protective coating 400, including portions of the protective coating 400 that are located over the electrical terminal 220, may be etched or otherwise removed from the electrical terminal 220 to expose the electrical terminal 220 for electrical coupling to another terminal.

With reference again to FIGS. 1 and 2A, as noted above, a cell 100 may include an electrical terminal (not shown) that extends through a surface 111 of the cell 100. The electrical terminal may connect the electrode assembly to an electrical terminal (not shown) of the circuit board 200 via lead plate 310 or lead plate 320. Accordingly, the electrical terminal may be exposed through a protective coating formed on the surface 111.

It is noted that FIGS. 1-2E are provided as a non-limiting example of a rechargeable battery and embodiments of the present disclosure may be applied to any known and suitable rechargeable battery. For example, although FIGS. 1-2E are directed to a cell including a single terminal on an upper surface (i.e., surface 115) and a single terminal on a lower surface (i.e., surface 111), the scope and applicability of the disclosed subject matter are not so limited. Rather, a cell may include any suitable number of terminals on each surface of a cell.

Figure 3A:
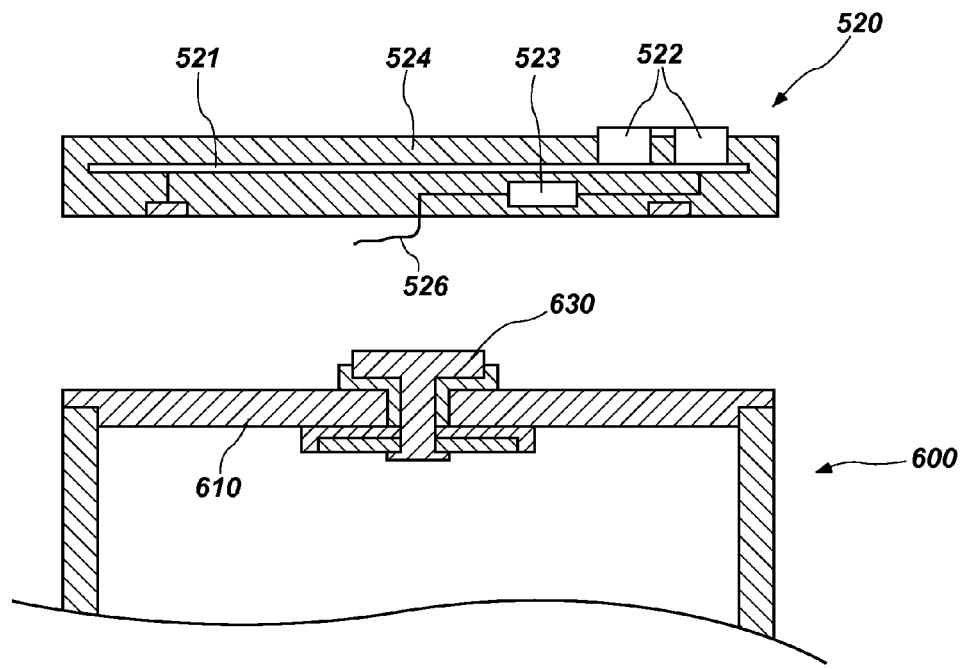
FIG. 3A is a side view of another embodiment of a rechargeable battery including a cell and a circuit board.

FIG. 3A is a schematic sectional view illustrating another example of a conventional rechargeable battery including a battery component part 520 and a cell 600. The battery component part 520 includes a circuit board 521 and a bimetal device 523 that are connected to each other in series through electric terminals, the protective circuit board 521 and the bimetal device 523 being encapsulated by a molding 524. The cell 600 includes a cap plate 610. A negative terminal 630 of the cell 600 is configured to protrude from cap plate 610 while being electrically insulated from the remaining parts of the cell 600. Meanwhile, in the battery component part 520, an electrode connection part 526, to which one electric terminal of the bimetal device 523 is connected, is formed by a multi-leaf spring. When the battery component part 520 is bonded to the cell 600, the multi-leaf spring is in contact with the terminal 630 of the cell 600 and causes deformation, thereby maintaining contact with the terminal 630. An electric terminal of the circuit board 521 and an electric terminal of the bimetal device 523 connect to connection leads (not shown) at the bottom surface of the battery component part 520. The connection leads are then electrically connected to the cap plate 610 of the cell 600 and the terminal 630, respectively.

Figure 3B:
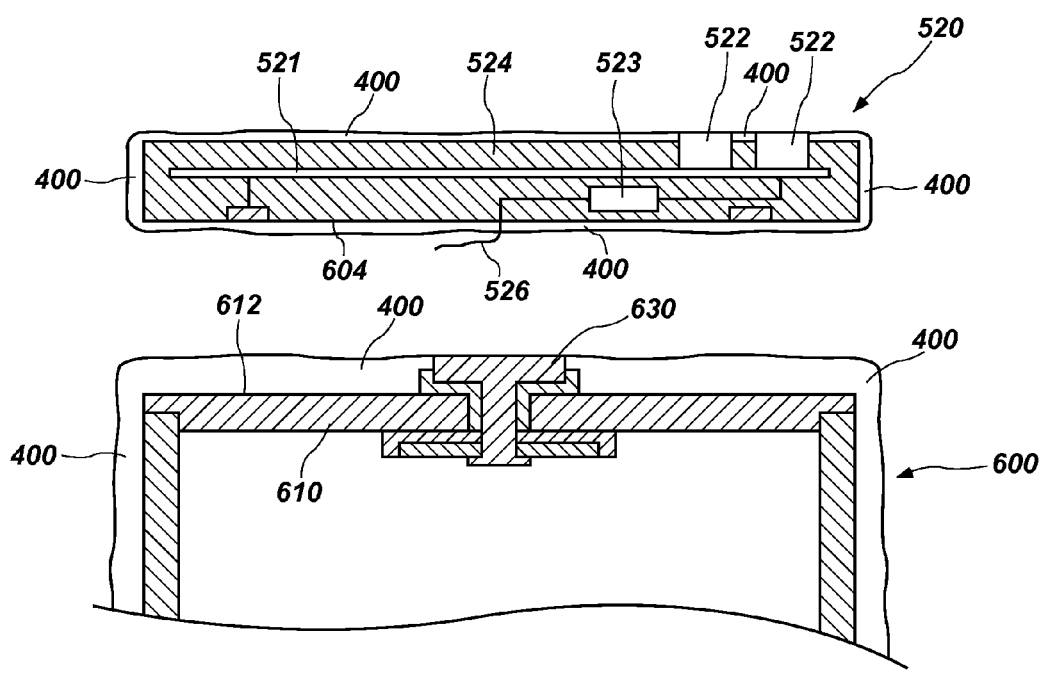
FIG. 3B is a side view of the embodiment of rechargeable battery of FIG. 3A, including a moisture resistant coating over a surface of the protective circuit board and another moisture resistant coating over a surface of the cell.
Figure 4:
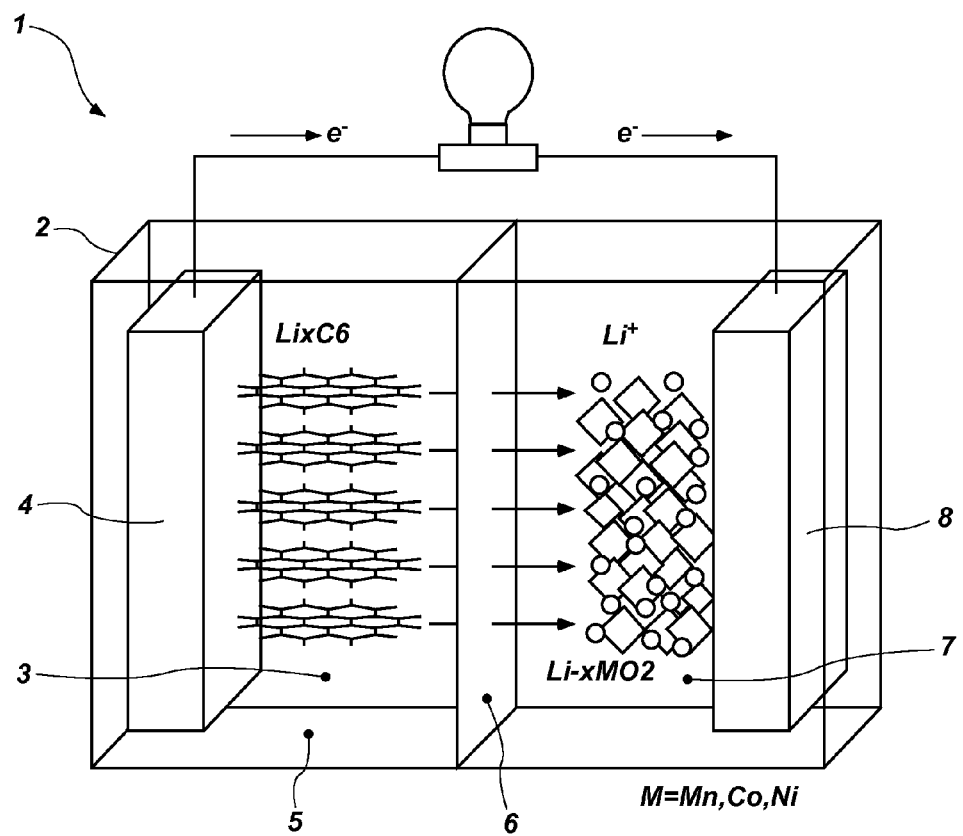
FIG. 4 illustrates an embodiment of a conventional lithium ion battery.

FIG. 3B illustrates a protective coating 400 over on an exterior surface of the component part 520 and an exterior surface of the cell 600. As illustrated in FIG. 3B, the terminal 630, the terminals 522, and the electrode connection part 526 are exposed through the protective coating 400. It is noted that although the protective coating 400 is illustrated as being disposed over substantially an entire exterior surface of the component part 520, the scope and applicability of the disclosed subject matter are not so limited. Rather, the protective coating 400 may be disposed on a portion of an exterior surface of the component part 520. Similarly, although protective coating 400 is illustrated as being disposed over substantially an entire exterior surface of the cell 600, the protective coating 400 may be disposed on a portion of an exterior surface of the cell 600.

According to one embodiment, a mask or coating release element may be applied to the electrode connection part 526, the electrical terminals 522, and the terminal 630 prior to forming or otherwise disposing the protective coating 400 on the component part 520 and the cell 600. The mask or coating release element and/or one or more portions of the protective coating 400 may then be removed to expose the electrode connection part 526, the terminals 522, and the terminal 630. It is noted that a mask or coating release element may be applied to any part of the component part 520 and the cell 600 that could be adversely affected by a protective coating. According to another embodiment, after protective coating 400 has been formed or otherwise disposed on the component part 520, including the electrode connection part 526 and the terminals 522, and on the cell 600, including the terminal 630, one or more portions of the protective coating 400 may be etched or otherwise removed from the electrode connection part 526, the terminals 522, the terminals 630 and any other features of the cell 600.

It is also noted that the protection component part 520 may be coupled (e.g., electrically and physically) to the cell 600 after the protective coating 400 has been applied to the surface 604 of the component part 520, the surface 612 of the cell 600, or both. Stated another way, although the protective coating 400 may be positioned between the component part 520 and the cell 600, it is not required that the protective coating 400 be applied to both the component part 520 and the cell 600 prior to coupling the component part 520 to the cell 600.

It is noted that the processes of defining protective coatings disclosed above (e.g., by masking, use of a coating release element, removing one or more portions of a protective coating, etc.) may be carried out by any known and suitable methods. Further, in some embodiments the protective coatings, as described herein, may vary physically (e.g., in thickness, in surface texture, etc.). Further, protective coatings may have different chemical properties (e.g., include different materials, comprise different types of protective coatings, impart moisture resistance in different ways (e.g., as a barrier, by imparting hydrophobicity, etc.), etc.) from one another. Other characteristics (e.g., transparency/opacity, thermal conductivity, etc.) may also vary in the protective coatings.

Any of a variety of metrics may be used to quantify the moisture resistance of each coating formed by an assembly system. For example, the ability of a coating to physically inhibit moisture from contacting a coated feature may be considered to impart the coating with moisture resistance.

As an example, the ability of a coating to prevent exposure of a coating component or feature to moisture may be based on more quantifiable data, such as the rate at which water permeates through the coating, or its water vapor transfer rate, which may be measured using known techniques in units of g/m²/day or in units of g/100 in²/day (e.g., less than 2 g/100 in²/day, about 1.5 g/100 in²/day or less, about 1 g/100 in²/day or less, about 0.5 g/100 in²/day or less, about 0.25 g/100 in²/day or less, about 0.15 g/100 in²/day or less, etc., through a film having a thickness of about 1 mil (i.e., about 25.4 µm), at a temperature of 37° and at a relative humidity of 90%).

Another way in which the moisture resistance of a coating may be determined is its water contact angle when water is applied to a surface of the coating by an acceptable technique (e.g., the static sessile drop method, the dynamic sessile drop method, etc.). The hydrophobicity of the surface may be measured by determining the angle the base of a water droplet makes with the surface, from beneath a base of the water droplet; for example, using the Young equation, i.e.:

$$\theta_C = \arccos \frac{r_A \cos\theta_A + r_R \cos\theta_R}{r_A + r_R},$$

where $\theta_A$ is the highest, or advancing, contact angle; $\theta_R$ is the lowest, or receding, contact angle;

$$r_A = \sqrt[3]{\frac{\sin^3\theta_A}{2 - 3\cos\theta_A + \cos^3\theta_A}} \text{ ; and } r_R = \sqrt[3]{\frac{\sin^3\theta_R}{2 - 3\cos\theta_R + \cos^3\theta_R}}.$$

If the surface is hydrophilic, the water will spread somewhat, forming a water contact angle of less than 90° with the surface. In contrast, a hydrophobic surface, which, for purposes of this disclosure, may be considered to be moisture resistant, will prevent the water from spreading, resulting in a water contact angle of 90° or greater. The more the water beads on a surface, the greater the water contact angle. When water droplets bead on a surface such that the water contact angle with the surface is about 120° or more, the surface is considered to be highly hydrophobic. When the angle at which water contacts a surface exceeds 150° (i.e., a water droplet on the surface is nearly spherical), the surface is said to be "superhydrophobic."

Of course, other measures of moisture resistance may also be employed.

Any of a variety of suitable materials, techniques and apparatus may be used to apply a protective coating to at least a portion of a subassembly or an assembly of electronic components. Without limitation, a protective coating 400 may be formed from reactive monomers, which monomers may then be deposited onto and form polymers on one or more surfaces that are to be made moisture resistant or moisture proof (e.g., waterproof, etc.). In specific embodiments, poly(p-xylylene) (i.e., Parylene), including unsubstituted and/or substituted units, may be deposited onto one or more surfaces that are to be rendered protective or moisture proof. Examples of processes for forming parylene coatings are described by U.S. patent application Ser. Nos. 12/104,080, 12/104,152 and 12/988,103, the entire disclosure of each of which is, by this reference, hereby incorporated herein. U.S. patent application Ser. Nos. 12/446,999, 12/669,074 and 12/740,119, the entire disclosures of all of which are, by this reference, hereby incorporated herein, disclose other embodiments of materials, techniques and equipment that may be used to form a protective coating 400.

Other techniques that may be employed to form a protective coating 400 include, without limitation, physical application processes (e.g., dipping, printing, spraying, rolling, brushing, etc.), chemical vapor deposition (CVD) (e.g., plasma-enhanced CVD (PECVD), etc.), atomic layer deposition (ALD), pulsed plasma deposition (PPD), physical vapor deposition (PVD) (e.g., evaporation deposition processes (including, but not limited to e-beam evaporation, sputtering, laser ablation, pulsed laser deposition, etc.). Of course, other techniques may also be used to form a protective coating 400.

Some alternative materials that may be used to form a protective coating 400 according to this disclosure may be impermeable to moisture and able to withstand exposure to one or more corrosive agents, such as electrolytes, corrosive gases and dust. Materials that may be used to form a protective coating 400 include, but are certainly not limited to, thermoplastic materials (e.g., acrylic resins, etc.), curable materials (e.g., radiation-curable materials, two-part materials (e.g., polyurethanes, etc.), thermoset materials (e.g., acrylic resins, etc.), room-temperature curable materials (e.g., silicones, etc.), etc.). Where appropriate, these materials may be hydrophobic (e.g., halogenated polymers, etc.). In some embodiments, a coating element may be configured to apply a protective film 30. In some embodiments, a protective coating 400 may include a plurality of different materials. Various examples of protective coatings 400 that include two or more different materials are disclosed in U.S. patent application Ser. No. 14/213,765, the entire disclosure of which is incorporated herein by this reference. Such a protective coating 400 may include a moisture impermeable lower portion and a hydrophobic exterior surface. In some embodiments, a protective coating 400 may include two or more layers of the same material.

Several experiments were conducted on lithium ion batteries to determine the effects of a protective coating on the lithium ion battery. Specifically, parylene protective coatings were applied to all of the outer surfaces of the lithium ion batteries, except for the contacts of the lithium ion batteries. The parylene coatings, which had average thicknesses of 5 µm to 7 µm, were applied by conventional CVD processes. The coated lithium ion batteries were then subjected to a variety of tests, the results of which are summarized in the EXAMPLES that follow.

Example 1

The thicknesses of three (3) lithium ion batteries, each having a capacity of 1320 mAh, were measured before and after application of parylene coatings to all of their outer surfaces. Thicknesses were measured at ten (10) locations across the surface of each lithium ion battery. Each measurement was repeated five (5) times. The greatest variations in thickness were 0.08 mm at any location, which is less than 10% of the original thickness of the lithium ion battery.

Example 2

Thirty-three (33) lithium ion batteries were coated with parylene using conventional CVD processes. Each coating had an average thickness of 5 µm to 7 µm. These lithium ion batteries were subjected to standard cell pouch impedance testing, in which a cell pouch impedance of greater than 20 MΩ is required to pass. Cell pouch impedance testing was conducted on the day the lithium ion batteries were coated with parylene (day 0) and again at 1, 4, 7, 15, 22, 30 37, 44, 51, 60 and 85 days after coating. Each of the thirty-three parylene coated lithium ion batteries passed each cell pouch impedance test, with each battery having a cell pouch impedance exceeding the minimum impedance by at least 15 MΩ.

Example 3

Five (5) lithium ion batteries were coated with parylene having an average thickness of 5 μm to 7 μm, again using CVD processes. All five (5) lithium ion batteries were charged to 100%. The batteries were then opened and inspected to determine whether or not electrolyte had leaked from the cell, the current collectors had been damaged and any mechanical damage had occurred within the cell. No abnormalities were observed for any of the five (5) batteries.

Example 4

Ten (10) lithium ion batteries, which were coated with parylene having an average thickness of 5 μm to 7 μm, again using CVD processes, were subjected to environmental testing. All ten (10) lithium ion batteries were charged to 100% and weighed. The lithium ion batteries were then placed in an environmental chamber maintained at a temperature of 60° C.±2° C. and a humidity of 90% to 95% for fifteen (15) days. At the completion of the fifteen (15) days, the lithium ion batteries were weighed again. The greatest weight change measured in any of the lithium ion batteries was 0.04% (for seven (7) of the lithium ion batteries—all increases in weight; the remaining three (3) lithium ion batteries increased in weight by 0.03%.

Example 5

Ten (10) lithium ion batteries were subjected to life cycle testing, in which a lithium ion battery that retains at least 80% of its normal charging capacity over the course of testing passes the test (i.e., 300 cycles of charging and discharging at a temperature of 0.5° C.). Five (5) of the lithium ion batteries were used as controls (i.e., they remained uncoated), while the other five (5) lithium ion batteries were CVD-coated with parylene having an average thickness of 5 μm to 7 μm. All five (5) of the control lithium ion batteries passed the life cycle test, as did all five (5) of the protectively coated lithium ion batteries. When the life cycle testing was complete, the charging capacities of the protectively coated lithium ion batteries (about 85%) were only slightly less (about 2% or 3% less) than the charging capacities (about 87%) of the control lithium ion batteries.

Example 6

One hundred (100) lithium ion batteries were subjected to a vacuum for four (4) hours, and then CVD-coated with parylene to provide protective coatings with average thicknesses from 5 μm to 7 μm. After coating, the charging capacity of each lithium ion battery was tested. After at least two days had passed following application of the protective coatings, the lithium ion batteries were subjected to standard IPx7 testing. The charging capacity of each lithium ion battery was then re-tested. None of the lithium ion batteries failed, with each lithium ion battery substantially retaining is full charging capacity (i.e., at least 95% of its full charging capacity) after coating and after IPx7 testing; in fact, on average, the lithium ion batteries retained at least 98% of their full charging capacities following IPx7 testing.

Although the foregoing description contains many specifics, these should not be construed as limiting the scope of any of the appended claims, but merely as providing information pertinent to some specific embodiments that may fall within the scopes of the appended claims. Features from different embodiments may be employed in combination. In addition, other embodiments may also be devised which lie within the scopes of the appended claims. The scope of each claim is, therefore, indicated and limited only by the plain language used in appended claims and the legal equivalents to the elements of the claims. All additions, deletions and modifications to the disclosed subject matter that fall within the meaning and scopes of the claims are to be embraced by the claims.

What is claimed:

1. A method for preventing exposure of an energy storage device to moisture and corrosive agents, comprising:
    applying a first protective coating to at least a portion of at least one surface of a cell of an energy storage device having a first electrical terminal, the first protective coating comprising a moisture resistant coating formed from a material that will withstand exposure to corrosive agents, including electrolytes, corrosive gases and dust;
    applying a second protective coating to at least a portion of at least one surface of a circuit board having a second electrical terminal, the second protective coating comprising a moisture resistant coating formed from a material that will withstand exposure to corrosive agents, including electrolytes, corrosive gases and dust; and
    etching the first protective coating from the first electrical terminal and the second protective coating from the second electrical terminal; and
    electrically coupling the first electrical terminal to the second electrical terminal; and
        wherein etching is performed prior to coupling the first and second electrical terminals.

2. The method of claim 1, further comprising masking the first electrical terminal prior to applying the first protective coating to the at least a portion of the at least one surface of the cell.

3. The method of claim 2, further comprising masking the second electrical terminal prior to applying the second protective coating to the at least a portion of the at least one surface of the circuit board.

4. The method of claim 1, wherein applying the first protective coating or applying the second protective coating comprises at least one of atomic layer deposition, chemical vapor deposition, pulsed plasma deposition and physical vapor deposition.

5. The method of claim 1, wherein applying the first protective coating or applying the second protective coating comprises applying a protective coating by dip-coating, screen painting or dispensing.

6. The method of claim 1, wherein applying the protective coating comprises covering the cell with the protective coating to seal electrolytes within the cell.

7. The method of claim 1, wherein applying the protective coating comprises applying a protective layer comprising a plurality of layers to at least the portion of the surface of the energy storage assembly.

8. The method of claim 1, wherein the energy storage device includes an interconnect disposed between the cell and the circuit board, and applying the protective coating comprises applying the protective coating to a surface of the interconnect.

9. A method for preventing exposure of an energy storage device to moisture and corrosive agents, comprising:
   masking a first electrical terminal of a cell of an energy storage device;
   applying a first protective coating to at least a portion of at least one surface of the cell of the energy storage device, the first protective coating comprising a moisture resistant coating formed from a material that will withstand exposure to corrosive agents, including electrolytes, corrosive gases and dust;
      wherein masking the first electrical terminal is performed prior to applying the first protective coating to at least a portion of at least one surface of the cell;
   masking a second electrical terminal of a circuit board;
   applying a second protective coating to at least a portion of at least one surface of the circuit board, the second protective coating comprising a moisture resistant coating formed from a material that will withstand exposure to corrosive agents, including electrolytes, corrosive gases and dust; and
      wherein masking the second electrical terminal is performed prior to applying the second protective coating to at least a portion of at least one surface of the circuit board; and
   electrically coupling the first electrical terminal to the second electrical terminal.

10. The method of claim 9, further comprising etching the first protective coating from the first electrical terminal and the second protective coating from the second electrical terminal prior to coupling the first and second electrical terminals.

11. The method of claim 9, wherein applying the first protective coating or applying the second protective coating comprises at least one of atomic layer deposition, chemical vapor deposition, pulsed plasma deposition and physical vapor deposition.

12. The method of claim 9, wherein applying the first protective coating or applying the second protective coating comprises applying a protective coating by dip-coating, screen painting or dispensing.

13. The method of claim 9, wherein applying the protective coating comprises covering the cell with the protective coating to seal electrolytes within the cell.

14. The method of claim 9, wherein applying the protective coating comprises applying a protective layer comprising a plurality of layers to at least the portion of the surface of the energy storage assembly.

15. The method of claim 9, wherein the energy storage device includes an interconnect disposed between the cell and the circuit board, and applying the protective coating comprises applying the protective coating to a surface of the interconnect.

* * * * *